(12) United States Patent
Chao et al.

(10) Patent No.: US 12,374,550 B2
(45) Date of Patent: Jul. 29, 2025

(54) PHOTOMASK ASSEMBLY, PATTERNED MASK AND METHOD FOR FORMING THE SAME, AND METHOD FOR FORMING ACTIVE REGION

(71) Applicant: CHANGXIN MEMORY TECHNOLOGIES, INC., Hefei (CN)

(72) Inventors: Fufang Chao, Hefei (CN); Junjun Zhang, Hefei (CN); Zhimin Wu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 826 days.

(21) Appl. No.: 17/449,458

(22) Filed: Sep. 30, 2021

(65) Prior Publication Data

US 2022/0301873 A1   Sep. 22, 2022

Related U.S. Application Data

(63) Continuation of application No. PCT/CN2021/105188, filed on Jul. 8, 2021.

(30) Foreign Application Priority Data

Mar. 19, 2021   (CN) .......................... 202110295543.0

(51) Int. Cl.
   *G03F 7/20* (2006.01)
   *G03F 7/00* (2006.01)
   (Continued)

(52) U.S. Cl.
   CPC ...... *H01L 21/0338* (2013.01); *G03F 7/70466* (2013.01); *H01L 21/0335* (2013.01); *H01L 21/0337* (2013.01); *H01L 21/76224* (2013.01)

(58) Field of Classification Search
   None
   See application file for complete search history.

(56) References Cited

U.S. PATENT DOCUMENTS 8,298,956 B2   10/2012   Yang
8,450,833 B2    5/2013   Kim
(Continued)

FOREIGN PATENT DOCUMENTS

CN   103246156 A       8/2013
CN   105789049 A   *   7/2016   ......... H01L 21/0273
(Continued)

*Primary Examiner* — Martin J Angebranndt
(74) *Attorney, Agent, or Firm* — Syncoda LLC; Feng Ma

(57) ABSTRACT

A photomask assembly includes: a first photomask for forming a first patterned structure, the first patterned structure having a first patterned opening which includes a plurality of strip-shaped patterns, a distance between the strip-shaped patterns at the two sides of a boundary between the first region and the second region being greater than a distance between other every two neighboring strip-shaped patterns when the center of the first photomask coincides with the center of the substrate; and a second photomask for forming a second patterned region which covers a first patterned opening of a second region, a distance between an opening edge of the second patterned structure and the neighboring strip-shaped pattern being greater than a first preset distance when the center of the second photomask and the center of the first photomask coincide with the center of the substrate.

15 Claims, 25 Drawing Sheets

(51) Int. Cl.
*H01L 21/033* (2006.01)
*H01L 21/76* (2006.01)
*H01L 21/762* (2006.01)

(56) References Cited

U.S. PATENT DOCUMENTS

| | | | |
|---|---|---|---|
| 8,664,077 B2 | 3/2014 | Nair | |
| 9,417,517 B2 | 8/2016 | Kato | |
| 9,911,606 B2 | 3/2018 | Chiang et al. | |
| 10,522,348 B2 | 12/2019 | Tran et al. | |
| 2013/0174103 A1* | 7/2013 | Shieh | G03F 1/38 |
| | | | 716/54 |
| 2013/0210213 A1 | 8/2013 | Nair | |
| 2013/0273750 A1* | 10/2013 | Shieh | H01L 21/02002 |
| | | | 438/795 |
| 2014/0141578 A1* | 5/2014 | Brink | H01L 27/1211 |
| | | | 438/163 |
| 2015/0004532 A1 | 1/2015 | Kato | |
| 2016/0293443 A1 | 10/2016 | Ban et al. | |

FOREIGN PATENT DOCUMENTS

| | | | | |
|---|---|---|---|---|
| CN | 106200272 A | | 12/2016 | |
| CN | 106952865 A | | 7/2017 | |
| CN | 108519725 A | | 9/2018 | |
| CN | 109767977 A | | 5/2019 | |
| CN | 110890328 A | | 3/2020 | |
| CN | 112271179 A | | 1/2021 | |
| CN | 113066715 A | | 7/2021 | |
| JP | 2011071235 A | * | 4/2011 | ..... H01L 21/823431 |
| JP | 2015084389 A | * | 4/2015 | |
| TW | 201409581 A | * | 3/2014 | ......... H01L 21/3065 |
| WO | WO-2019132891 A1 | * | 7/2019 | ..... H01L 21/823821 |

* cited by examiner

PHOTOMASK ASSEMBLY, PATTERNED MASK AND METHOD FOR FORMING THE SAME, AND METHOD FOR FORMING ACTIVE REGION

CROSS-REFERENCE TO RELATED APPLICATIONS

This is a continuation of International Patent Application No. PCT/CN2021/105188 filed on Jul. 8, 2021, which claims priority to Chinese Patent Application No. 202110295543.0 filed Mar. 19, 2021. The disclosures of these applications are hereby incorporated by reference in their entirety.

BACKGROUND

During the manufacturing process of a semiconductor device, it is usually necessary to form a patterned mask on a substrate to facilitate subsequent processes.

SUMMARY

The present disclosure relates to the technical field of semiconductors, and in particular to, a photomask assembly, a patterned mask and a method for forming the same, and a method for forming an active region.

A photomask assembly is configured to form a patterned mask on a substrate, the substrate including a first region, and a second region surrounding the first region. The photomask assembly includes a first photomask, a second photomask and a third photomask.

The first photomask is configured to form a first patterned structure on the substrate, the first patterned structure having a first patterned opening, the first patterned opening including a plurality of strip-shaped patterns, and a distance between the strip-shaped patterns at the two sides of a boundary between the first region and the second region being greater than a distance between other every two neighboring strip-shaped patterns when the center of the first photomask coincides with the center of the substrate.

The second photomask is configured to form a second patterned region which is configured to cover a first patterned opening of a second region and is provided with a second patterned opening, the second patterned opening being configured to expose the first patterned opening in the first region, and a distance between an opening edge of the second patterned structure and the neighboring strip-shaped pattern being greater than a first preset distance when the center of the second photomask and the center of the first photomask coincide with the center of the substrate.

The third photomask is configured to form a third patterned structure, the first region including a first sub region and second sub regions, the second sub regions being positioned at the two sides of the first sub region in an extending direction of the strip-shaped patterns, and the third patterned structure being formed in the first sub region, and covering the first patterned opening in the first sub region.

The first photomask formed with the first patterned structure is improved, so that a distance between the strip-shaped patterns at the two sides of the boundary between the first region and the second region is greater than a distance between the strip-shaped patterns in the first region while the center of the first photomask coincides with the center of the substrate. And meanwhile, the photomask formed with the second patterned structure is improved in direction to form the second photomask, so that a distance between the opening edge of the second patterned structure and the neighboring strip-shaped pattern is greater than the first preset distance when the center of the second photomask and the center of the first photomask coincide with the center of the substrate. As a result, even though the second photomask has offset in an X direction, the finally-formed patterned mask is not easily caused to be lack of a strip-shaped pattern (namely a virtual line) as the conventional art, such that yield loss is reduced.

A patterned mask forming method includes:

The photomask assembly according to any one of the above is provided.

A first patterned structure is formed on a substrate based on a first photomask, the first patterned structure having a first patterned opening, the first patterned opening including a plurality of strip-shaped patterns, the substrate having a first region, and a second region surrounding the first region, and a distance between the strip-shaped patterns at the two sides of a boundary between the first region and the second region being greater than a distance between other every two neighboring strip-shaped patterns.

A second patterned structure is formed based on a second photomask, the second patterned structure covering the first patterned opening of the second region, and exposing the first patterned opening in the first region, and a distance between an opening edge of the second patterned structure and the neighboring strip-shaped pattern being greater than a first preset distance when the center of the second photomask and the center of the first photomask coincide with the center of the substrate.

A third patterned structure is formed based on a third photomask, the first region including a first sub region and second sub regions, the second sub regions being positioned at the two sides of the first sub region in an extending direction of the strip-shaped patterns, and the third patterned structure being formed in the first sub region, and covering the first patterned opening in the first sub region.

The patterned mask is formed by removing the first patterned opening between the second patterned structure and the third patterned structure.

A method for forming an active region includes the following operations.

A patterned mask is formed according to the patterned mask forming method.

An active pattern structure is formed in strip-shaped patterns of the patterned mask.

The substrate is etched based on the active pattern structure to form shallow grooves.

The shallow grooves are filled with an insulating material to form a shallow groove isolating structure, the shallow groove isolating structure isolating the substrate into a plurality of active regions arranged at intervals.

A patterned mask, formed according to any one of the above the patterned mask forming methods.

BRIEF DESCRIPTION OF THE DRAWINGS

In order to describe the technical solutions in the embodiments of the present disclosure or the conventional art more clearly, the drawings needed to be used in the embodiments or the conventional art will be simply introduced below. Apparently, the drawings in the following description are only some embodiments of the present disclosure. Those of ordinary skill in the art may further obtain other drawings according to these drawings without creative work.

DETAILED DESCRIPTION

Figure 1:
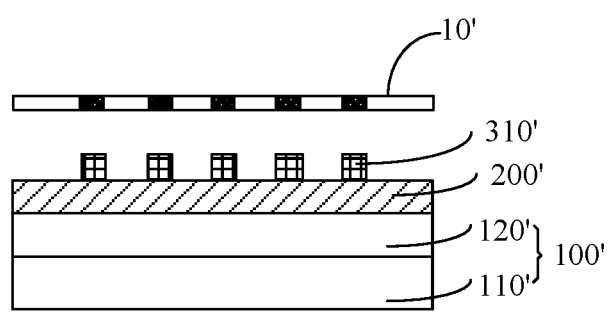
FIG. 1 is a first schematic diagram showing a semiconductor structure in a patterned mask forming process.

To facilitate an understanding of the present disclosure, the present disclosure will be described below in detail with reference to the accompanying drawings. Preferred embodiments of the present disclosure are given in the accompanying drawings. However, the present disclosure may be embodied in many different forms and should not be limited to the embodiments set forth herein. Rather, these embodiments are provided so that the present disclosure will be thorough and complete.

Unless defined otherwise, all technical and scientific terms used herein have the same meaning as commonly understood by those of ordinary skill in the art to which the present disclosure belongs. The terms used herein in the specification of the present disclosure are for the purpose of describing specific embodiments only and are not intended to limit the present disclosure.

It is to be understood that when an element or a layer is referred to as being "on", "adjacent to", "connected to", or "coupled to", to other elements or layers, it may be directly on, adjacent to, connected to, or coupled to the other elements or layers, or an intervening element or layer may be present. Rather, when an element is referred to as being "directly on", "directly adjacent to", "directly connected to", or "directly coupled to" other elements or layers, it may be directly on, adjacent to, connected to, or coupled to the other elements or layers, or an intervening element or layer may be absent. It is to be understood that although the terms first, second, third, and the like may be used to describe various elements, components, regions, layers, doping types, and/or parts, these elements, components, regions, layers, doping types, and/or parts should not be limited by these terms. These terms are only used to distinguish one element, component, region, layer, doping type, or part from another element, component, region, layer, doping type, or part. Therefore, without departing from the teachings of the disclosure, the first element, component, region, layer, doping type or part discussed below can be expressed as a second element, component, region, layer or part.

Spatial relation terms such as "under", "underneath", "lower", "below", "above", "upper", and the like, may be used herein to describe a relation between one element or feature and other elements or features as illustrated in the figures. It is to be understood that in addition to the orientation shown in the figures, the spatial relation terms further include different orientations of a device in use and operation. For example, if the device in the figures is turned over, the element or feature described as "underneath the other element" or "below it" or "under it", the element or feature will be oriented "over" the other element or feature. Therefore, the exemplary terms "underneath" and "below" may include both upper and lower orientations. In addition, the device may also include additional orientations (for example, rotated 90 degrees or other orientations), and the spatial descriptors used herein are interpreted accordingly.

As used herein, the singular forms "a", "an", and "the/the" may include the plural forms as well, unless the context clearly indicates otherwise. It is also to be understood that when the terms "constituting" and/or "comprising" are used in the specification, the presence of a stated feature, integer, step, operation, element, and/or component may be determined, but the presence or addition of one or more other features, integers, steps, operations, elements, components, and/or groups is not precluded. Meanwhile, the term "and/or" used herein includes any and all combinations of the associated listed items.

The embodiments of the disclosure are described herein with reference to sectional views that are used as schematic diagrams of ideal embodiments (intervening structures) of the embodiments of the present disclosure, so that changes in shape may be expected due to, for example, a manufacturing technique and/or a tolerance. Therefore, the embodiments of the present disclosure should not be limited to special shapes of regions shown herein but include shape offsets caused by the manufacturing technique.

A patterned mask is usually formed through three photomasks. First, a first patterned structure is formed on the substrate through a first photomask; next, a second patterned structure covering the first patterned structure at a second region of the edge is formed through a second photomask; and afterwards, through a third photomask, a first patterned structure is formed covering an exposed first region in the center of the second patterned structure. A patterned mask is therefore formed by removing the first patterned structure between the third patterned structure and the second patterned structure.

When the patterned mask is formed by such methods, the process is complex and difficult to control, easily resulting in photomasks offset to cause yield loss.

The inventors of the present disclosure have recognized that the yield loss is easily caused if the mask is offset.

In an example, a patterned mask forming method may include the following operations.

At step S10, a first sacrificial material layer 200' and a first mask material layer are sequentially formed on a substrate 100', and the first mask material layer is patterned based on a first photomask 10' to form a first mask pattern 310' with reference to FIG. 1.

Figure 2:
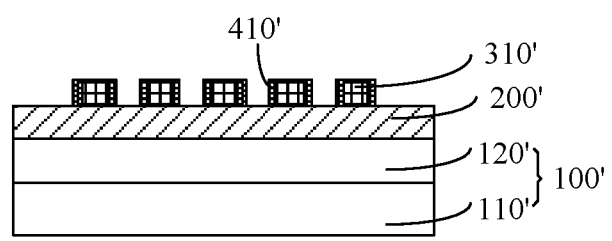
FIG. 2 is a second schematic diagram showing a semiconductor structure in a patterned mask forming process.

At step S20, a second mask pattern 410' is formed on the side wall of the first mask pattern 310' with reference to FIG. 2.

Figure 3:
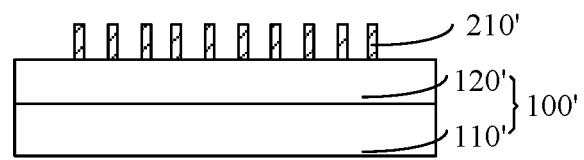
FIG. 3 is a third schematic diagram showing a semiconductor structure in a patterned mask forming process.

At step S30, the first sacrificial material layer 200' is etched based on the second mask pattern 410' to form a first sacrificial pattern 210' with reference to FIG. 3.

Figure 4:
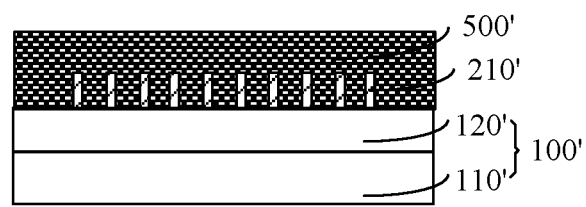
FIG. 4 is a fourth schematic diagram showing a semiconductor structure in a patterned mask forming process.

At step S40, a first patterned material layer 500' covering the first sacrificial pattern 210' is formed with reference to FIG. 4.

Figure 5:
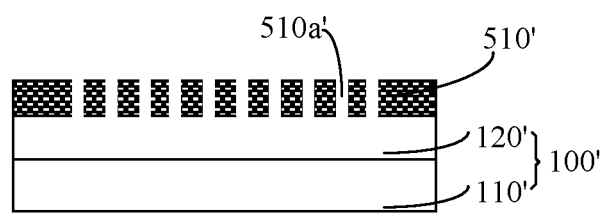
FIG. 5 is a fifth schematic diagram showing a semiconductor structure in a patterned mask forming process.

At step S50, the first patterned material layer 500' is etched to form a first patterned structure 510', the upper surface of the first patterned structure 510' being not higher than the upper surface of the first sacrificial pattern 210' with reference to FIG. 5.

Figure 6:
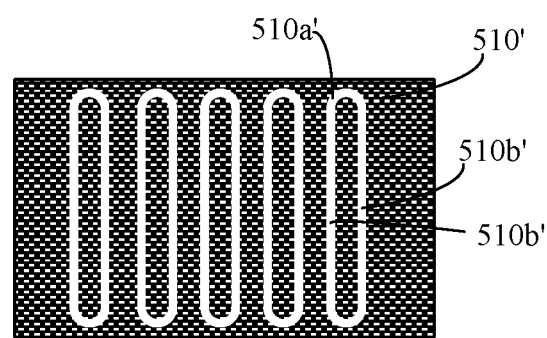
FIG. 6 is a sixth schematic diagram showing a semiconductor structure in a patterned mask forming process.

At step S60, the first sacrificial pattern 210' is removed to form the first patterned structure 510' with a first patterned opening 510'a, the first patterned opening 510'a including a plurality of strip-shaped patterns 510'b, and each strip-shaped pattern 510'b forming a virtual line with reference to FIG. 5 and FIG. 6.

Figure 7:
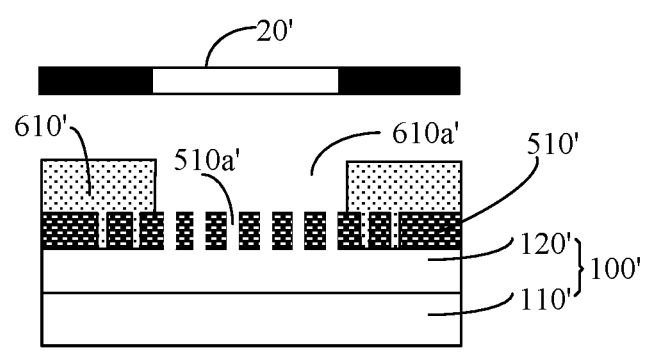
FIG. 7 is a seventh schematic diagram showing a semiconductor structure in a patterned mask forming process.
Figure 8:
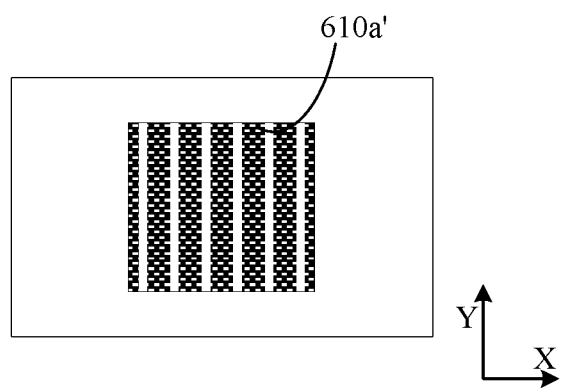
FIG. 8 is an eighth schematic diagram showing a semiconductor structure in a patterned mask forming process.

At step S70, a second patterned material layer is formed on the first patterned structure 510', and the second patterned material layer is patterned based on a second photomask 20' to form a second patterned structure 610', the second patterned structure 610' covering the edge region of the first patterned structure 510' with reference to FIG. 7 and FIG. 8.

Figure 9:
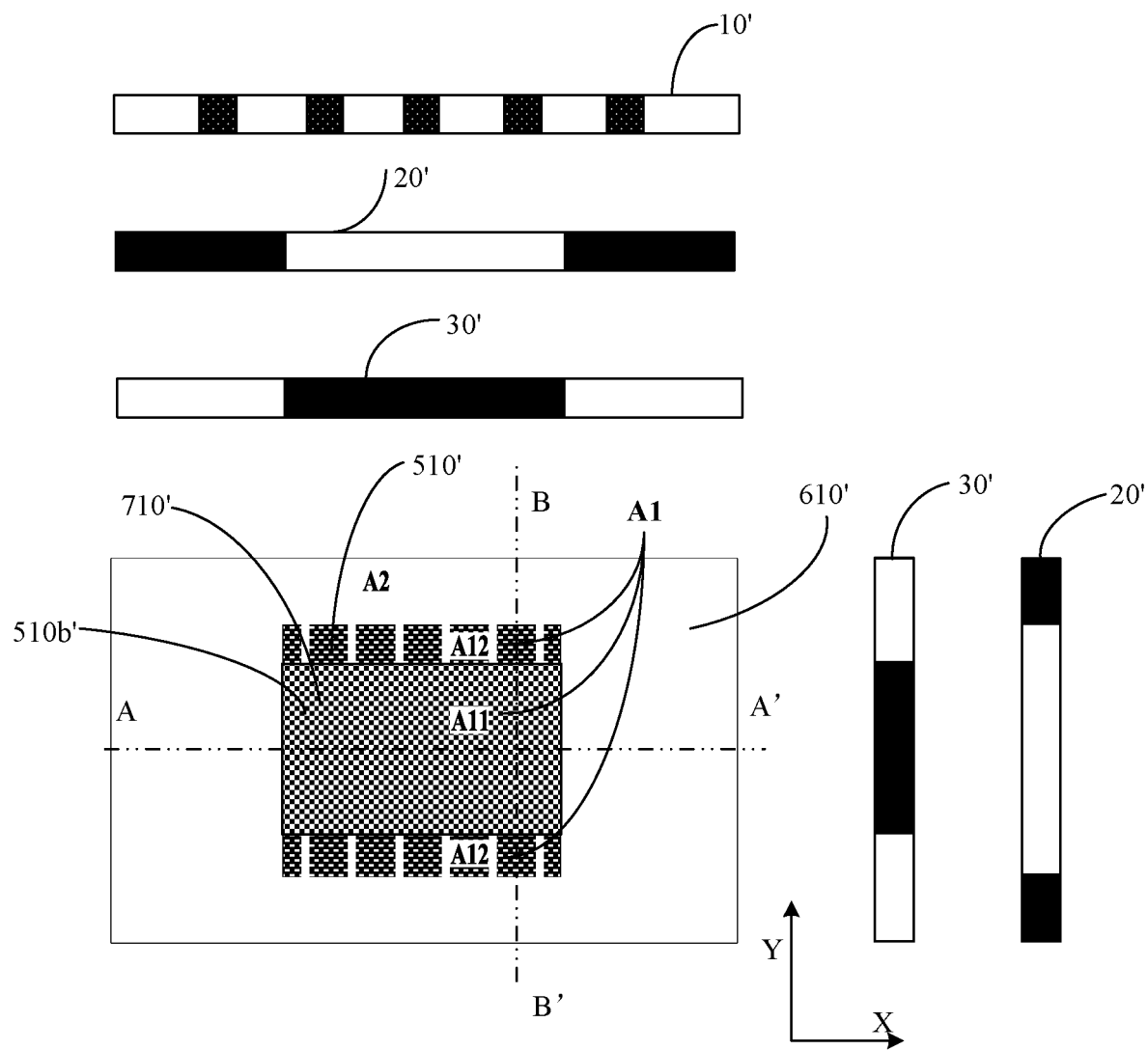
FIG. 9 is a ninth schematic diagram showing a semiconductor structure in a patterned mask forming process.
Figure 10:
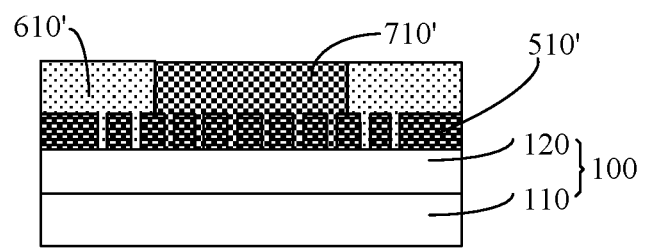
FIG. 10 is a tenth schematic diagram showing a semiconductor structure in a patterned mask forming process.
Figure 11:
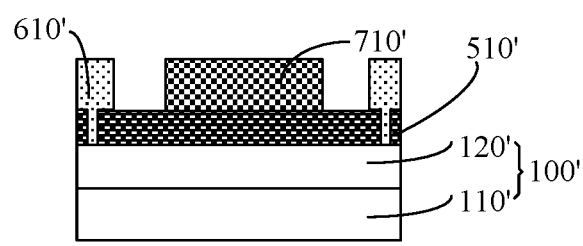
FIG. 11 is an eleventh schematic diagram showing a semiconductor structure in a patterned mask forming process.

At step S80, a third patterned material layer is formed on the first patterned structure 510', and the third patterned material layer is patterned based on a third photomask 30' to form a third patterned structure 710', the third patterned structure 710' covering a central region of the first patterned structure 510' with reference to FIG. 9, FIG. 10 and FIG. 11.

FIG. 10 is a schematic cross-sectional view in an AA' direction of FIG. 9, and FIG. 11 is a schematic cross-sectional view in a BB' direction of FIG. 9.

At step S90, the first patterned opening 510'a between the third patterned structure 710' and the second patterned structure 610' is removed to form a patterned mask.

While the patterned mask is formed by the method, yield loss is easily caused if the photomasks are offset.

Figure 12:
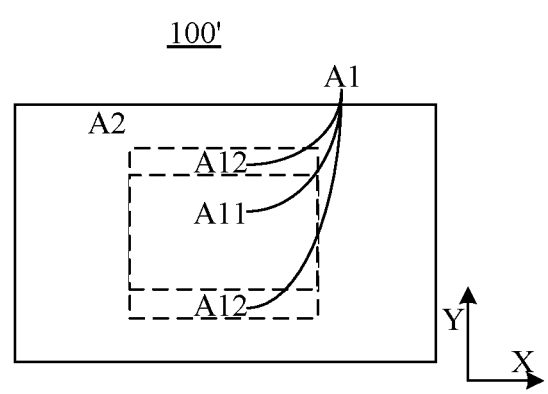
FIG. 12 is a twelfth schematic diagram showing a semiconductor structure in a patterned mask forming process.

Specifically, referring to FIG. 12 and FIG. 9, the substrate 100' is provided with a first region A1, and a second region A2 surrounding the first region. The first region A1 includes a first sub region A11 and second sub regions A12, in the Y direction (an extending direction of the strip-shaped patterns 510'b), the second sub regions A12 being positioned at the two sides of the first sub region A11. Under an ideal state, the second patterned structure 610' is positioned in the second region A2 and the third patterned structure 710' positioned in the first sub region A11 while the first photomask 10', the second photomask 20' and the third photomask 30' are placed accurately.

The yield loss is easily caused as follows if the photomasks are offset.

Figure 13:
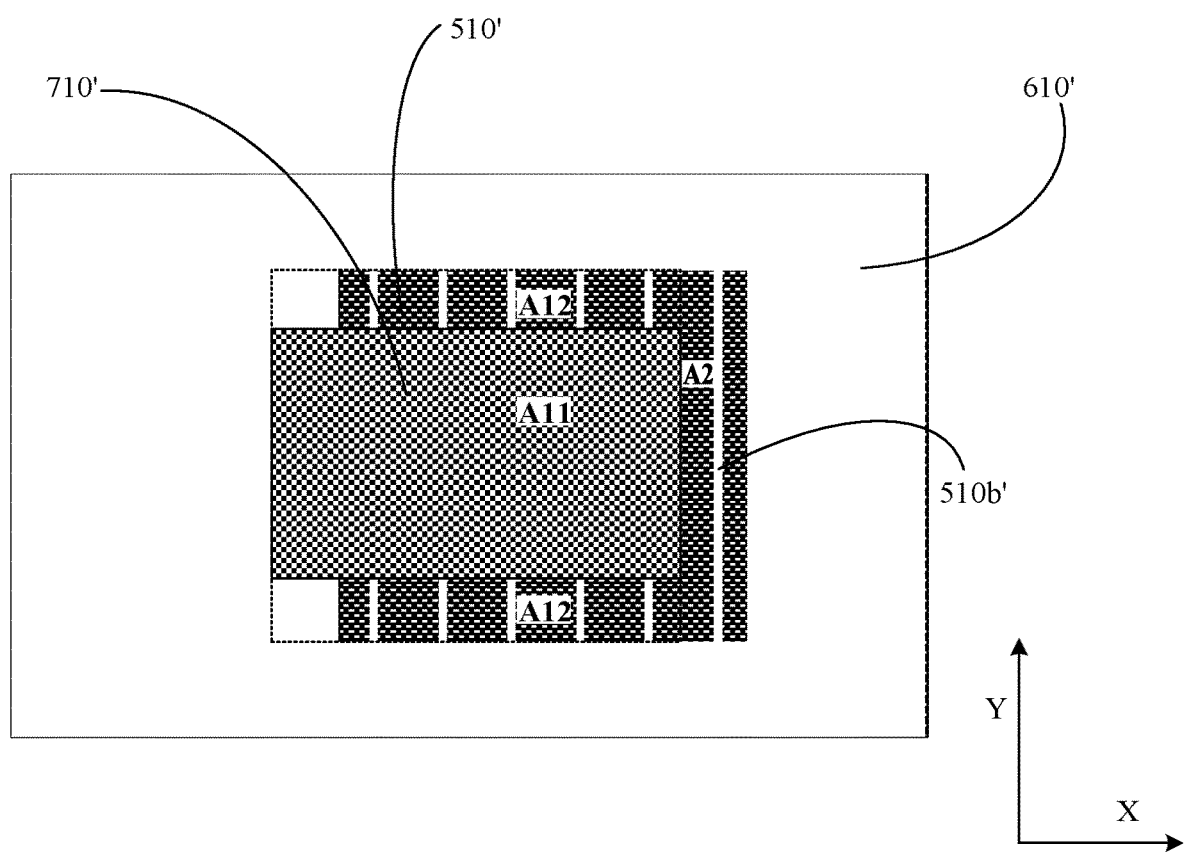
FIG. 13 is a thirteenth schematic diagram showing a semiconductor structure in a patterned mask forming process.

For example, referring to FIG. 13, part of strip-shaped patterns 510'b (the second strip-shaped pattern 510'b from the right in the figure) in the second sub regions A2 of the substrate may not be covered by the third patterned structure 710' if the second photomask 20' is offset in the X direction, and thus are removed in step S90. In such a manner, the finally formed patterned mask is lack of one strip-shaped pattern 510'b (namely a virtual line) to result in a first undesirable phenomenon.

Figure 14:
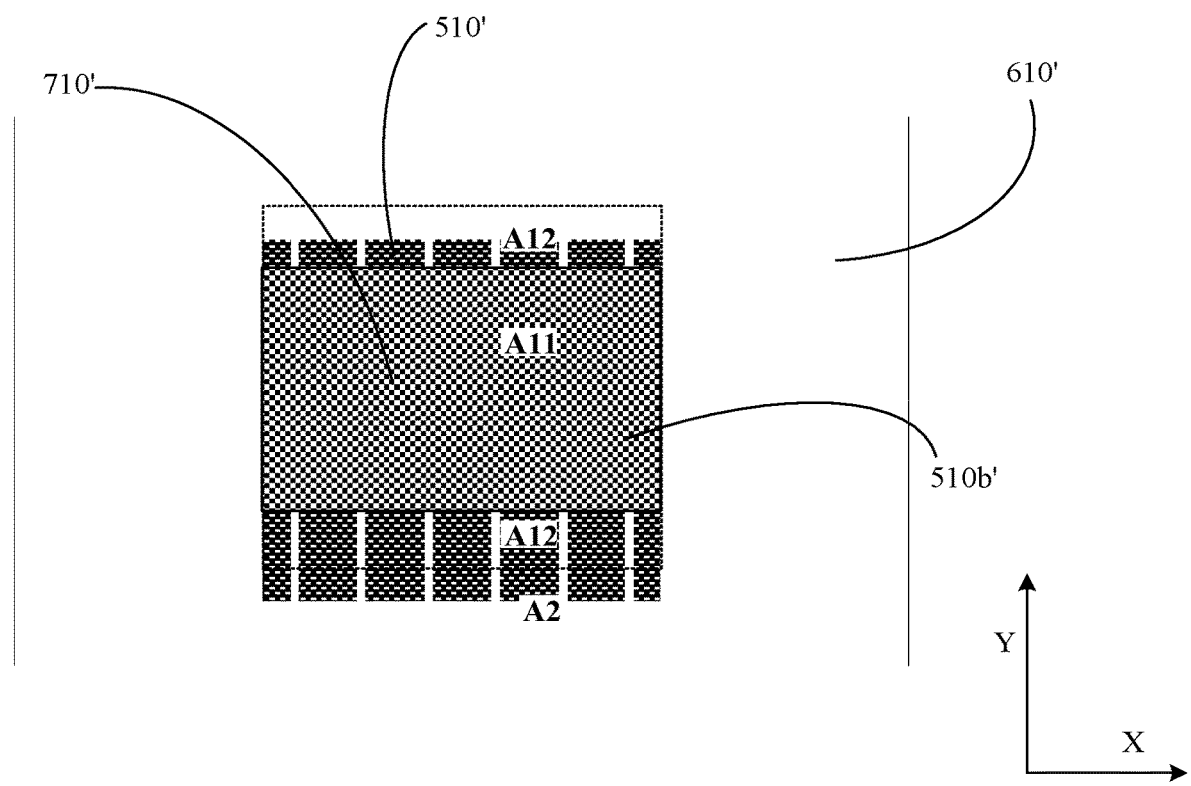
FIG. 14 is a fourteenth schematic diagram showing a semiconductor structure in a patterned mask forming process.

Referring to FIG. 14, part of the first patterned structure 510' in the second region A2 of the substrate may be exposed before step S90 if the second photomask 20' is offset in the Y direction, and thus is removed in step S90. In such a manner, a second undesirable phenomenon is caused.

Figure 15:
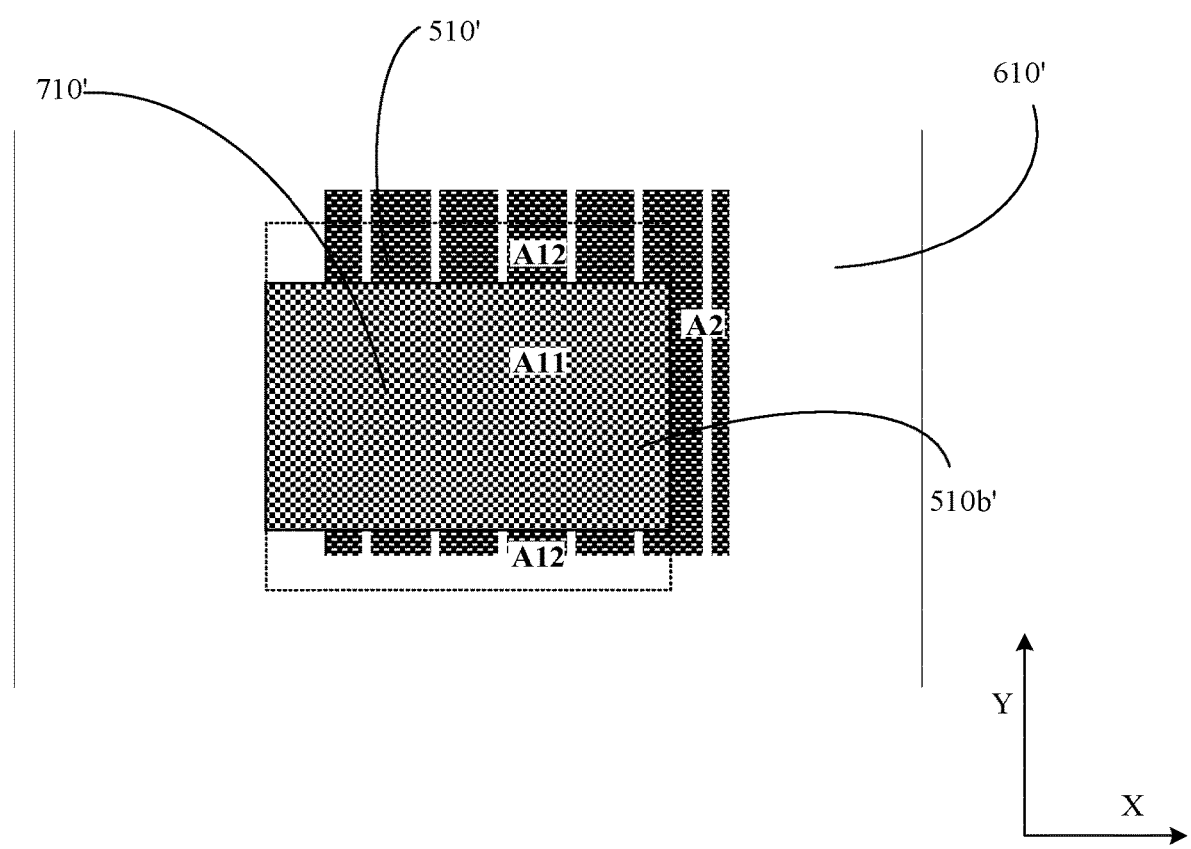
FIG. 15 is a fifteenth schematic diagram showing a semiconductor structure in a patterned mask forming process.
Figure 16:
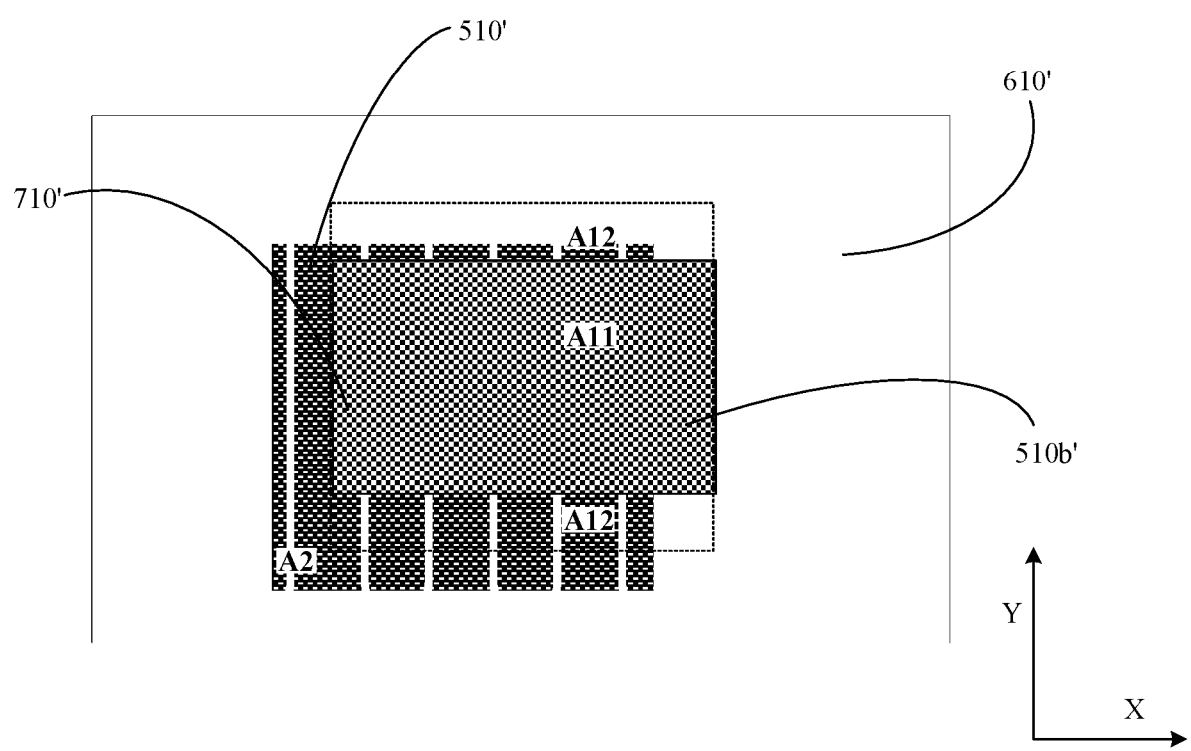
FIG. 16 is a sixteenth schematic diagram showing a semiconductor structure in a patterned mask forming process.

In addition, in a practical production process, a condition that the second photomask deviates in both the X direction and the Y direction may further occur. Referring to FIG. 15 and FIG. 16, both the first undesirable phenomenon and the second undesirable phenomenon exist.

Based on this, a photomask assembly, a patterned mask and a method for forming the same, and a method for forming an active region are provided.

In an embodiment, a photomask assembly is provided for forming a patterned mask on a substrate 100. Referring to FIG. 12, the substrate 100 is the same with the substrate 100', and is provided with a first region A1, and a second region A2 surrounding the first region A1. The first region A1 includes a first sub region A11 and second sub regions A12. In the Y direction, the second sub regions A12 are positioned at the two sides of the first sub region A11.

Figure 17:
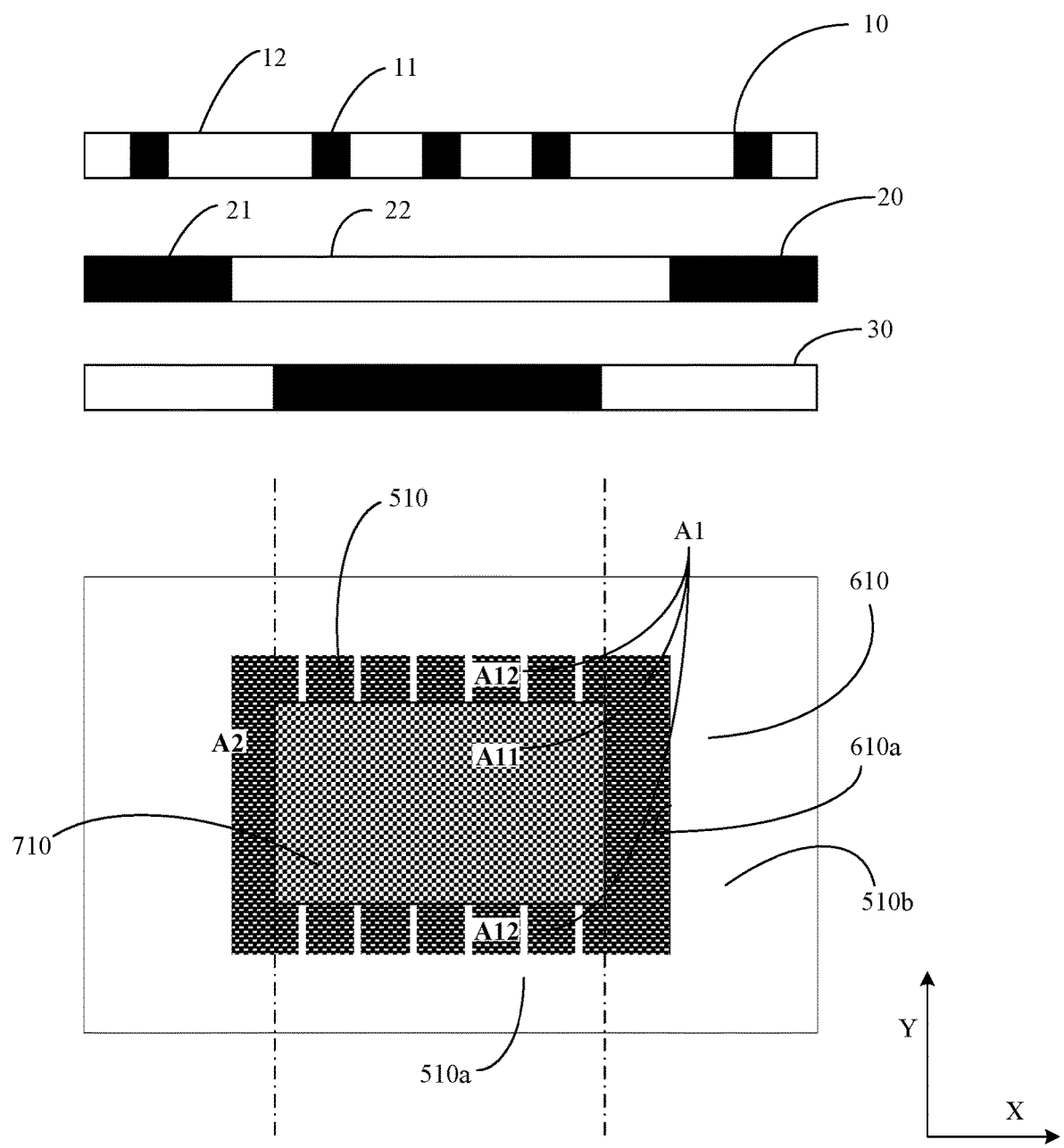
FIG. 17 is a schematic plan view showing a photomask assembly and a semiconductor structure after a third patterned structure is formed based on a photomask assembly provided in an embodiment of the present disclosure.

Referring to FIG. 17, the photomask assembly includes a first photomask 10, a second photomask 20 and a third photomask 30.

The first photomask 10 is configured to form a first patterned structure 510 on the substrate 100, the first patterned structure 510 having a first patterned opening 510a. The first patterned opening 510a includes a plurality of strip-shaped patterns 510b extending in the Y direction. A distance between strip-shaped patterns 510b at the two sides of a boundary between the first region A1 and the second region A2 is greater than a distance between other neighboring two strip-shaped patterns 510b.

As an example, the way that the first patterned structure 510 is formed on the substrate 100 through the first photomask 10 can be a way that the first patterned structure 510 is formed on the substrate 100' the first photomask 10' as described in step S10 to step S60. That is, the first patterned structure 510 can be formed on the substrate 100 through a multi-graphics forming method.

However, referring to FIG. 17, in the embodiment, the first photomask 10 is a photomask obtained after improving the first photomask 10'. When the center of the first photomask 10 coincides with the center of the substrate 100, a distance between the strip-shaped patterns 510*b* at the two sides of the boundary between the first region A1 and the second region A2 is greater than a distance between the strip-shaped patterns 510*b* in the first region A1.

As an example, referring to FIG. 17, the first photomask 10 can include a plurality of shielding portions 11 and a plurality of light transmission portions 12. The first photomask 10 can realize the function by adjusting the length of the first shielding portions 11 and/or the interval among the first shielding portions 11 and the like.

The first photomask 20 is configured to form a second patterned structure 610, the second patterned structure 610 being configured to cover a first patterned opening 510*a* of the second region A2 and having a second patterned opening 610*a*. The second patterned opening 610*a* is configured to expose the first patterned opening 510*a* in the first region A1.

The way that the second patterned structure 610 is formed through the second photomask 20 can be a way that the second patterned structure 610 is formed through the second photomask 20' as described in step S70. However, referring to FIG. 17, in the embodiment, the second photomask 20 is a photomask obtained after improving the second photomask 20'. When the center of the second photomask 20 and the center of the first photomask coincide with the center of the substrate 100, a distance between the opening edge of the second patterned structure 610 and the neighboring first patterned opening 510*a* in the first region A1 is greater than a first preset distance.

Figure 18:
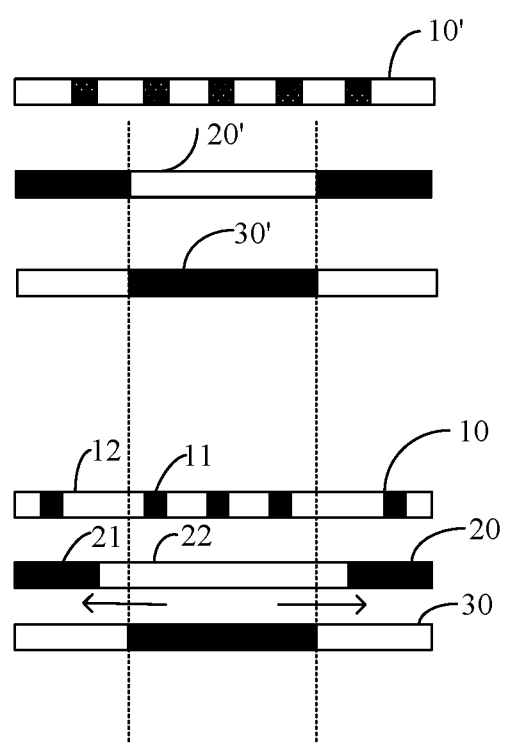
FIG. 18 is a schematic diagram showing comparison in an X direction between a photomask assembly provided in an embodiment of the present disclosure and a typical photomask assembly.

As an example, referring to FIG. 17 and FIG. 18, the second photomask 20 can include a plurality of second shielding portions 21 and a plurality of second light transmission portions 22. The positions of the second shielding portions 21 of the second photomask 20 can be adjusted, so that the two sides of each of the second shielding portions 21 are outwards pushed in the X direction relative to the second photomask 20'. In such a manner, the second photomask 20 can realize the functions. At this same, positive photoresist needs to be matched with the second photomask 20, so that the second photomask 20 can realize the functions.

Of course, the second photomask 20 also can be complementary with the light transmission portions and the shielding portions of the second photomask 20 as shown in FIG. 17. At this same, negative photoresist needs to be matched with the second photomask 20, so that the second photomask 20 can realize the functions.

A third photomask 30 is configured to form a third patterned structure 710. Referring to FIG. 17, the third patterned structure 710 is formed in the first sub region A11 and is configured to cover the first patterned opening 510*a* in the first sub region A11.

The way that the third patterned structure 710 is formed through the third photomask 30 can be a way that the third patterned structure 710 is formed through the third photomask 30' as described in step S80. The third photomask 30 can be the third photomask 30'.

The first patterned opening 510*a* between the third patterned structure 710 and the second patterned structure 610 can be finally removed to form a patterned mask as described in step S90 after the third patterned structure 710 is formed.

In the embodiment, the photomask formed with the first patterned structure is improved to form the first photomask 10. In such a manner, when the center of the first photomask 10 coincides with the center of the substrate 100, the distance between the strip-shaped patterns 510*b* at the two sides of the boundary between the first region A1 and the second region A2 is greater than the distance between the strip-shaped patterns 510*b* in the first region A1. At the same time, the photomask formed with the second patterned structure in the X direction is improved to form a second photomask 20. In such a manner, when the center of the second photomask 20 and the center of the first photomask 10 coincide with the center of the substrate 100, a distance between the opening edge of the second patterned structure 610 and the neighboring strip-shaped pattern 510*b* is greater than a first preset distance.

Figure 19:
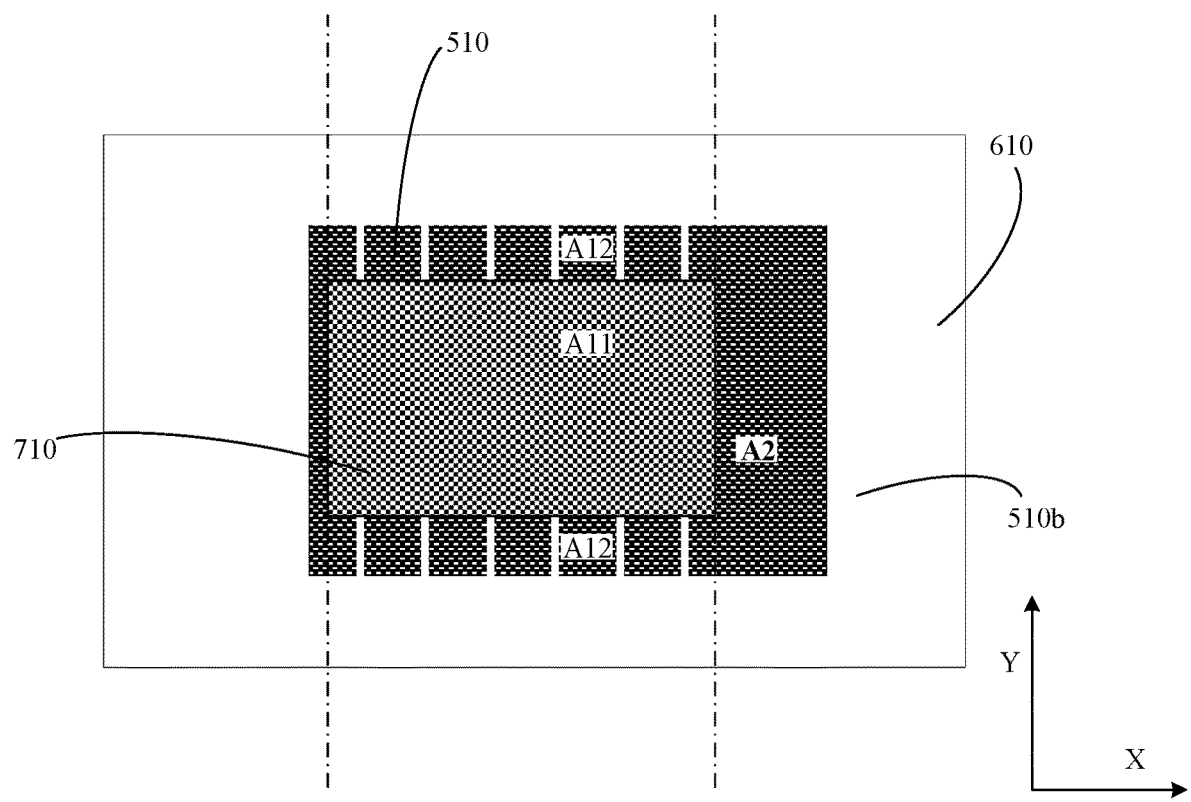
FIG. 19 is a schematic plan view showing a semiconductor structure formed when a second photomask has offset in an X direction in an embodiment of the present disclosure.

As a result, referring to FIG. 19 at this time, even though the second photomask 20 is offset in an X direction, the finally formed patterned mask is not easily caused to be lack of a strip-shaped pattern 510*b* (namely a virtual line) like the conventional technology, so that yield loss is improved.

It can be understood that the first preset distance is a distance for controlling occurrence probability of a first undesirable phenomenon within a distance within the range of process requirements, which can be set according to practical needs.

In an embodiment, when the center of the second photomask 20 and the center of the first photomask 10 coincide with the center of the substrate 100, distances between the opening edge of the second patterned structure 610 and two neighboring strip-shaped patterns 510*b* at two sides thereof are identical.

At this time, the second photomask 20 can have a greater offset space in a positive direction and a negative direction of the X direction, so that a process window in which the second patterned structure 610 is formed through the second photomask 20 is effectively increased.

Of course, in other embodiments, when the center of the second photomask 20 and the center of the first photomask 10 coincide with the center of the substrate 100, a distance between the opening edge of the second patterned structure 610 and the neighboring strip-shaped patterns 510*b* at the two sides has certain offset. As long as the distance between the opening edge of the second patterned structure 610 and the neighboring strip-shaped patterns 510*b* at the two sides is greater than the first preset distance, the occurrence probability of the first undesirable phenomenon can be controlled to be within the range of the process requirements.

In an embodiment, when the center of the second photomask 20 and the center of the third photomask 30 coincide with the center of the substrate 100, a distance between the opening edge of the second patterned structure 610 and the third patterned structure 710 is smaller than a second preset distance in the Y direction (namely the extending direction of the strip-shaped patterns).

Figure 20:
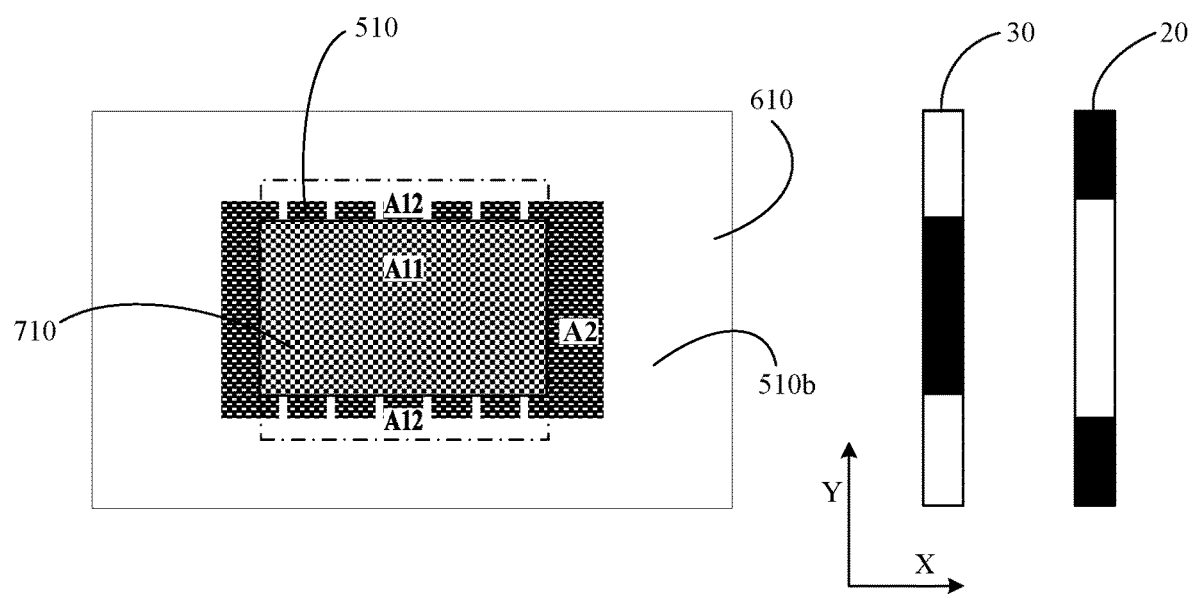
FIG. 20 is a schematic plan view showing a second photomask, a third photomask and a semiconductor structure formed with a third patterned structure in an embodiment of the present disclosure.
Figure 21:
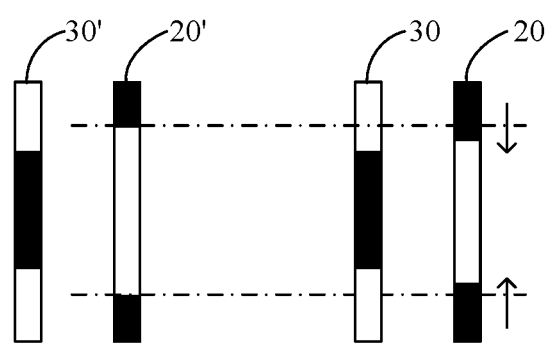
FIG. 21 is a schematic diagram showing comparison in a Y direction between a photomask assembly provided in an embodiment of the present disclosure and a typical photomask assembly.

At this time, as an example, referring to FIG. 20 and FIG. 21, the second photomask 20 can include a plurality of second shielding portions 21. The positions of the second shielding portions 21 of the second photomask 20 can be adjusted, so that the two sides of each of the second shielding portions 21 are outwards pushed in the Y direction relative to the typical second photomask 20'. In such a manner, the second photomask 20 can realize the functions.

At this same, positive photoresist needs to be matched with the second photomask 20, so that the second photomask 20 can realize the functions.

Of course, the second photomask 20 also can be complementary with the light transmission portions and the shielding portions of the second photomask 20 as shown in FIG. 21. At this same, negative photoresist needs to be matched with the second photomask 20, so that the second photomask 20 can realize the functions.

Figure 22:
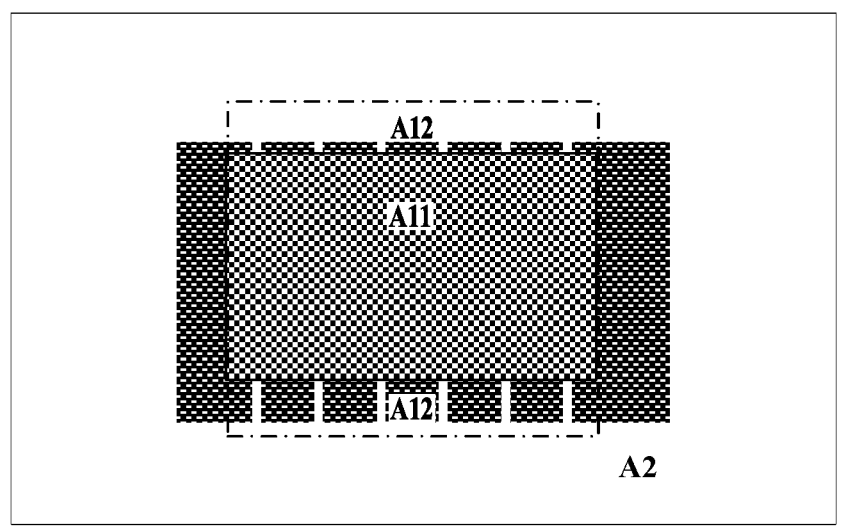
FIG. 22 is a schematic plan view showing a semiconductor structure formed when a second photomask has offset in a Y direction in an embodiment of the present disclosure.

At this time, referring to FIG. 22, part of the first patterned structure 510 in the second region A2 of the substrate may be not easily exposed before step S90 as the conventional technologies even through the second photomask 20 is offset in the Y direction, and thus is removed in step S90. In such a manner, a second undesirable phenomenon can be effectively prevented.

It can be understood that the second preset distance is a distance for controlling occurrence probability of the second undesirable phenomenon within a distance within the range of process requirements, which can be specifically set according to practical needs.

In an embodiment, referring to FIG. 17, the first photomask 10 can include a plurality of first shielding portions 11. The plurality of first shielding portions 11 define a light transmission region of the first photomask. The portion on which the first light transmission region of the first photomask is located is the first light transmission portion 12.

The first photomask 10 is configured to form the first patterned structure on the substrate through a multi-graphics forming method.

As this time, the way that the first patterned structure 510 is formed on the substrate 100 through the first photomask 10 can be a way as described in step S10 to step S60. In addition, the first photomask 10 is matched with the positive photoresist, such that orthographic projections of the strip-shaped patterns 510a on the substrate 100 are positioned at two sides of orthographic projections of the first shielding portions 11 on the substrate 100.

As an example, the first patterned opening 510a in which the strip-shaped patterns 510b formed through the first photomask 10 are located can have a racetrack shape, and an orthographic projection of the first patterned opening on the substrate 100 surrounds the orthographic projections of the first shielding portions 11 on the substrate 100. The annular first patterned opening 510a includes two parallel and opposing strip-shaped patterns 510b.

Figure 23:
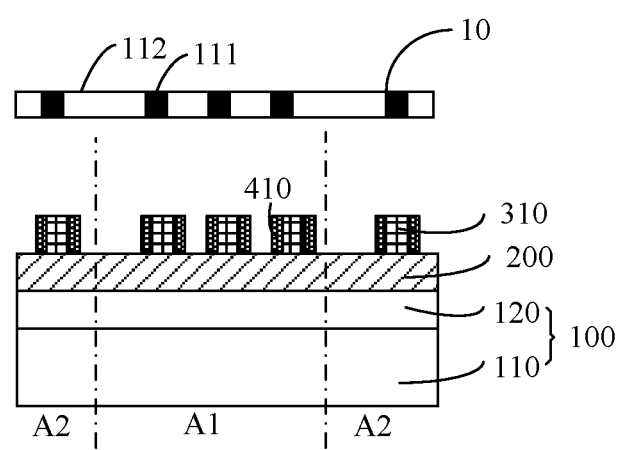
FIG. 23 is a schematic cross-sectional view showing a first photomask and a semiconductor structure after a first sacrificial pattern is formed based on the first photomask in an embodiment of the present disclosure.

Specifically, in an embodiment, referring to FIG. 23, each of the plurality of first shielding portions 11 can include first sub portions 111 and second sub portions 112. When the center of the first photomask 10 coincides with the center of the substrate 100, the first sub portions 111 are positioned in the first region A1 and the second sub portions 112 are positioned in the second regions A2.

In addition, a distance between neighboring first portion 111 and second sub portion 112 is greater than a distance between every two first sub portions 111. In addition, a distance between neighboring first portion 111 and second sub portion 112 is greater than a distance between every two second sub portions 112.

At this time, when the center of the first photomask 10 coincides with the center of the substrate 100, a distance between strip-shaped patterns 510b at the two sides of a boundary between the first region A1 and the second region A2 can be greater than a distance between other neighboring two strip-shaped patterns 510b.

Figure 24:
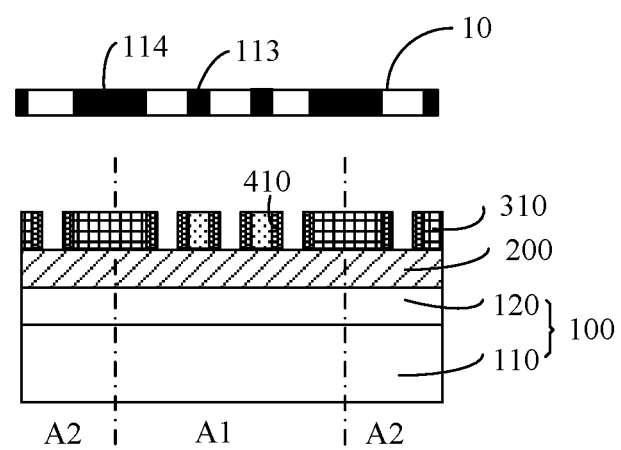
FIG. 24 is a schematic cross-sectional view showing a first photomask and a semiconductor structure after a first sacrificial pattern is formed based on the first photomask in another embodiment of the present disclosure.

Alternatively, in an embodiment, referring to FIG. 24, a plurality of first shielding portions 11 are provided each including third sub portions 113 and fourth sub portions 114. The third sub portions 113 are positioned in the first region A1 and the second region A2. At the same time, in the X direction (namely the direction perpendicular to the extending direction of the strip-shaped patterns), the fourth sub portions 114 span between the first region A1 and the second region A2.

At the same time, the length of the fourth sub portions 114 in that direction is greater than a distance between the fourth sub portion 114 and its neighboring third sub portion 113.

At this time, when the center of the first photomask 10 coincides with the center of the substrate 100, a distance between strip-shaped patterns 510b at the two sides of a boundary between the first region A1 and the second region A2 can be greater than a distance between other neighboring two strip-shaped patterns 510b.

The first photomask 10 in the embodiment is matched with the positive photoresist to realize the functions. Of course, in other embodiments, the first photomask 10 also can be complementary with the light transmission portions and the shielding portions of the first photomask 10. At this same, negative photoresist needs to be matched with the first photomask, such that the first photomask can realize the functions.

Figure 25:
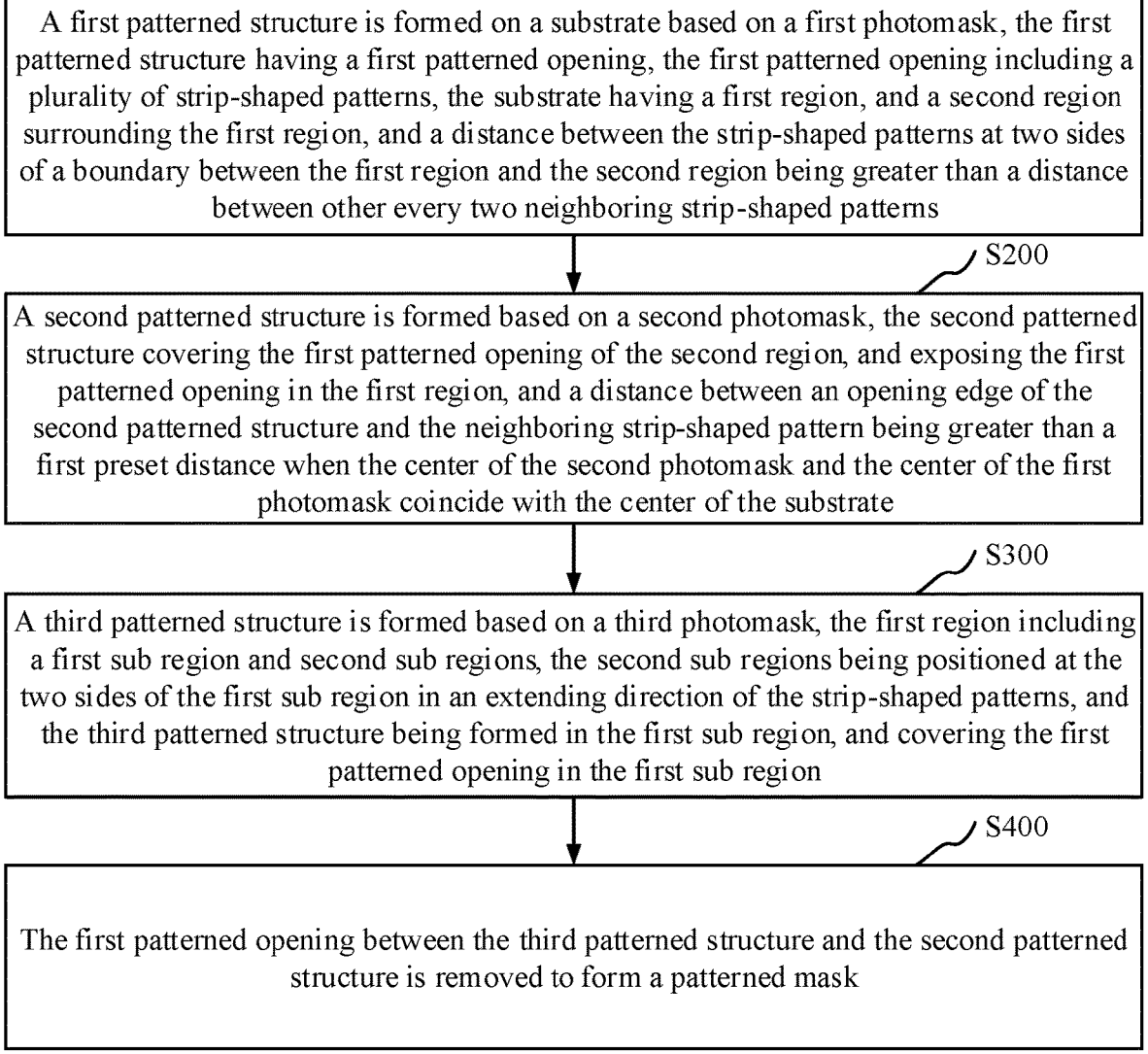
FIG. 25 is flowchart showing a patterned mask forming method in an embodiment of the present disclosure.

In an embodiment, referring to FIG. 25, a patterned mask forming method includes the following operations.

At step S100, a first patterned structure 510 is formed on a substrate based on a first photomask 10, the first patterned structure 150 having a first patterned opening 150a, the first patterned opening 150a including a plurality of strip-shaped patterns 150b, the substrate 100 having a first region A1, and a second region A2 surrounding the first region A1, and a distance between the strip-shaped patterns 150b at the two sides of a boundary between the first region A1 and the second region A2 being greater than a distance between other every two neighboring strip-shaped patterns 510b.

At step S200, a second patterned structure 610 is formed based on a second photomask 20, the second patterned structure 610 covering the first patterned opening 510a of the second region A2, and exposing the first patterned opening 510a in the first region A1, and a distance between an opening edge of the second patterned structure 610 and the neighboring strip-shaped pattern 510b being greater than a first preset distance when the center of the second photomask 20 and the center of the first photomask 10 coincide with the center of the substrate 100.

At step S300, a third patterned structure 710 is formed based on a third photomask 30, the first region A1 including a first sub region A11 and second sub regions A12, the second sub regions A12 being positioned at the two sides of the first sub region A11 in an extending direction of the strip-shaped patterns, and the third patterned structure being formed in the first sub region A11, and covering the first patterned opening 510A in the first sub region A11.

At step S400, the first patterned opening between the third patterned structure 610 and the second patterned structure 710 is removed to form a patterned mask.

Based on the photomask assembly in the embodiment, the improved first photomask and second photomask can be used to effectively prevent a first undesirable phenomenon when the photomasks are offset.

In an embodiment, with the adoption of the second photomask 20, when the center of the second photomask 20 and the center of the first photomask 10 coincide with the center of the substrate, distances between the opening edge of the second patterned structure 20 and two neighboring strip-shaped patterns 510b at two sides thereof are identical.

At this time, the second photomask 20 can have a greater offset space in a positive direction and a negative direction of the X direction, so that a process window in which the second patterned structure 610 is formed through the second photomask 20 is effectively increased.

In an embodiment, step S100 includes the following operation.

Based on the first photomask, the first patterned structure is formed on the substrate 100 through a multi-graphics forming method.

At this time, after one-time photolithography is completed, non-lithography process steps (thin film deposition, etching, etc.) can be successively used to achieve spatial frequency doubling of a photolithography pattern.

In an embodiment, based on the first photomask, the way that the first patterned opening is formed on the substrate through the multi-graphics forming method can be the way that the first patterned structure 510 is formed on the substrate 100 through the first photomask 10' as described in step S10 to step S60.

Specifically, the following steps can be included.

At step S110, a first sacrificial material layer 200 and a first mask material layer 300 are sequentially formed on the substrate 100, and the first mask material layer 200 is patterned based on the first photomask 10 to form a first mask pattern 210.

At step S120, a second mask pattern 410 is formed on the side wall of the first mask pattern 210.

At step S130, the first sacrificial material layer 200 is etched based on the second mask pattern 410 to form a first sacrificial pattern 210.

At step S140, a first patterned material layer 500 covering the first sacrificial pattern 210 is formed.

At step S150, the first patterned material layer 500 is etched to form a first patterned structure 510, the upper surface of the first patterned structure 510 being not higher than the upper surface of the first sacrificial pattern 210.

At step S160, the first sacrificial pattern 210 is removed to the first patterned structure 510 with a first patterned opening 510a, the first patterned opening 510a including a plurality of strip-shaped patterns 510b, and each strip-shaped pattern 510b forming a virtual line.

In an embodiment, referring to FIG. 23 or FIG. 24, the substrate 100 includes a substrate base piece 110 and a protection layer 120. As an example, the substrate base piece 110 can be a silicon wafer and the like, and the protection layer 120 can be silicon nitride or silicon oxide and the like.

At this time, the first sacrificial material layer 200 is specifically formed on the protection layer 800. In the process, the protection layer 800 can effectively protect the substrate 100.

In an embodiment, a method for forming an active region includes the following steps.

At step S1, a patterned mask is formed according to the patterned mask forming method in the embodiment.

At step S2, an active pattern structure is formed in strip-shaped patterns of the patterned mask.

At step S3, the substrate is etched based on the active pattern structure to form shallow grooves.

At step S4, the shallow grooves are filled with an insulating material to form a shallow groove isolating structure, the shallow groove isolating structure isolating the substrate into a plurality of active regions which are arranged at intervals.

In an embodiment, a patterned mask is formed according to the patterned mask forming method in the embodiment.

Regarding the patterned mask forming method, the method for forming the active region and the specific definitions and technical effects of the patterned mask, please refer to the above definition of the photomask assembly, which will not be repeated here.

It should be understood that at least a portion of the steps in FIG. 25 may include multiple steps or multiple stages. These steps or stages are not necessarily executed at the same moment, but can be executed at different moments. The steps or stages are not necessarily executed sequentially, but may be executed alternately or alternately with at least a portion of other steps or steps or stages of such steps.

The technical features of the above embodiments may be combined freely. In order to describe briefly, the description is not made on all possible combinations of the technical features of the embodiments. However, the combinations of these technical features should be considered as a scope of the specification as long as there is no contradiction.

The above embodiments only express several embodiments of the present disclosure, are described in more detail, but are not to be construed as a limitation to the scope of the applied patent. It is to be noted that several variations and modifications may also be made by those skilled in the art without departing from the spirit of the present disclosure, which all fall within the protection scope of the present disclosure. Therefore, the protection scope of the patent of the present disclosure shall be subjected to the appended claims.

What is claimed is:

1. A photomask assembly, configured to form a patterned mask on a substrate, the substrate having a first region, and a second region surrounding the first region, the photomask assembly comprising:
   a first photomask, configured to form a first patterned structure on the substrate, the first patterned structure having a first patterned opening, the first patterned opening comprising a plurality of strip-shaped patterns, and a distance between the strip-shaped patterns at two sides of a boundary between the first region and the second region being greater than a distance between other every two neighboring strip-shaped patterns when a center of the first photomask coincides with a center of the substrate;
   a second photomask, configured to form a second patterned region, the second patterned region being configured to cover the first patterned opening of the second region and having a second patterned opening, the second patterned opening being configured to expose the first patterned opening in the first region, and a distance between an opening edge of the second patterned structure and the neighboring strip-shaped pattern being greater than a first preset distance when a center of the second photomask and the center of the first photomask coincide with the center of the substrate; and
   a third photomask, configured to form a third patterned structure, the first region comprising a first sub region and second sub regions, the second sub regions being positioned at two sides of the first sub region in an extending direction of the strip-shaped patterns, and the third patterned structure being formed in the first sub region, to cover the first patterned opening in the first sub region;

wherein the plurality of strip-shaped patterns are light shield strips extending along a second direction separated by light transmission portions;

wherein the second patterned opening is a rectangular light transmission portion surrounded by a light shielding portion;

wherein the first sub region being a rectangular light blocking region which has the same width in a first direction as the rectangular light transmission portion of the second photomask and a width in the second direction less than that of the rectangular light transmission portion of the second photomask and is surrounded by the second sub regions which are light transmission portions;

wherein the center of the first photomask, the center of the second photomask and a center of the third photomask coincide with the center of the substrate; and wherein an open edge of the second patterned structure and an open edge of the third patterned structure are located between the strip-shaped patterns at the two sides of the boundary between the first region and the second region and the other strip-shaped patterns within the first region.

2. The photomask assembly of claim 1, wherein when the center of the second photomask and the center of the first photomask coincide with the center of the substrate, distances between the opening edge of the second patterned structure and two neighboring strip-shaped patterns at two sides thereof are identical.

3. The photomask assembly of claim 1, wherein when the center of the second photomask and a center of the third photomask coincide with the center of the substrate, a distance between the opening edge of the second patterned structure and the third patterned structure is smaller than a second preset distance in the extending direction of the strip-shaped patterns.

4. The photomask assembly of claim 1, wherein the first photomask comprises a plurality of first shielding portions, the plurality of first shielding portions defining a light transmission region of the first photomask; the first photomask is configured to form a first patterned structure on the substrate through a multi-graphics forming method; and orthographic projections of the strip-shaped patterns on the substrate are positioned at two sides of orthographic projections of the first shielding portions on the substrate.

5. The photomask assembly of claim 4, wherein each of the plurality of first shielding portions comprises first sub portions and second sub portions; when the center of the first photomask and the center of the substrate are superposed, the first sub portions are positioned in the first region, and the second sub portions are positioned in the second region; and a distance between neighboring first sub portion and second sub portion is greater than a distance between every two first sub portions, and is a greater than a distance between every two second sub portions.

6. The photomask assembly of claim 4, wherein each of the plurality of first shielding portions comprises third sub portions and fourth sub portions, the third sub portions are positioned in the first region and the second region; in a direction perpendicular to the extending direction of the strip-shaped patterns, the fourth sub portions span between the first region and the second region, and a length of the fourth sub portions in the direction is greater than a distance between the fourth sub portions and neighboring the third sub portions.

7. The photomask assembly of claim 4, wherein the first patterned opening has an annular shape, an orthographic projection of the first patterned opening on the substrate surrounds orthographic projections of the first shielding portions on the substrate; and the annular first patterned opening comprises two parallel and opposing strip-shaped patterns.

8. The photomask assembly of claim 1, wherein
the first photomask includes a plurality of first shielding portions, the plurality of first shielding portions define a light transmission region of the first photomask, the portion on which the first light transmission region of the first photomask is located is the first light transmission portion;
the first photomask is matched with a positive photoresist, such that orthographic projections of the strip-shaped patterns on the substrate are positioned at two sides of orthographic projections of the first shielding portions on the substrate.

9. The photomask assembly of claim 1, wherein
the first photomask includes a plurality of first shielding portions, the plurality of first shielding portions define a light transmission region of the first photomask, the portion on which the first light transmission region of the first photomask is located is the first light transmission portion;
the first photomask is matched with a negative photoresist, such that orthographic projections of the strip-shaped patterns on the substrate are positioned at two sides of orthographic projections of the first light transmission portion on the substrate.

10. The photomask assembly of claim 1, wherein
the second photomask includes a plurality of second shielding portions and a plurality of second light transmission portions;
the second photomask is matched with a negative photoresist, the positions of the second light transmission portions of the second photomask are adjusted, so that the distance between an opening edge of the second patterned structure and the neighboring strip-shaped pattern being greater than a first preset distance.

11. A patterned mask forming method, comprising:
providing the photomask assembly of claim 1;
forming a first patterned structure on a substrate based on a first photomask, the first patterned structure having a first patterned opening, the first patterned opening comprising a plurality of strip-shaped patterns, the substrate having a first region, and a second region surrounding the first region, and a distance between the strip-shaped patterns at two sides of a boundary between the first region and the second region being greater than a distance between other every two neighboring strip-shaped patterns;
forming a second patterned structure based on a second photomask, the second patterned structure covering the first patterned opening of the second region, and exposing the first patterned opening in the first region, and a distance between an opening edge of the second patterned structure and the neighboring strip-shaped pattern being greater than a first preset distance when the center of the second photomask and the center of the first photomask coincide with the center of the substrate;
forming a third patterned structure based on a third photomask, the first region comprising a first sub region and second sub regions, the second sub regions being positioned at two sides of the first sub region in an extending direction of the strip-shaped patterns, and the third patterned structure being formed in the first sub region, and covering the first patterned opening in the first sub region; and removing the first patterned opening between the second patterned structure and the third patterned structure, and forming the patterned mask.

12. The method of claim 11, wherein when the center of the second photomask and the center of the first photomask coincide with the center of the substrate, distances between the opening edge of the second patterned structure and two neighboring strip-shaped patterns at two sides thereof are identical.

13. The method of claim 11, wherein when the center of the second photomask and the center of the third photomask coincide with the center of the substrate, a distance between the opening edge of the second patterned structure and the third patterned structure is smaller than a second preset distance in the extending direction of the strip-shaped patterns.

14. The method of claim 11, wherein said forming the first patterned structure on the substrate based on the first photomask comprises:

based on the first photomask, forming the first patterned structure on the substrate through a multi-graphics forming method.

15. A method for forming an active region, comprising:

forming a patterned mask according to the patterned mask forming method of claim 11;

forming an active pattern structure in the strip-shaped patterns of the patterned mask;

based on the active pattern structure, etching the substrate, to form shallow grooves; and filling the shallow grooves with an insulating material to form a shallow groove isolating structure, the shallow groove isolating structure isolating the substrate into a plurality of active regions arranged at intervals.

* * * * *